(12) United States Patent
Marino

(10) Patent No.: US 10,536,122 B2
(45) Date of Patent: *Jan. 14, 2020

(54) AMPLIFIER CIRCUIT, CORRESPONDING SYSTEM AND DEVICE

(71) Applicant: STMicroelectronics S.r.l., Agrate Brianza (IT)

(72) Inventor: Edoardo Marino, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

This patent is subject to a terminal disclaimer.

(21) Appl. No.: 16/282,208

(22) Filed: Feb. 21, 2019

(65) Prior Publication Data

US 2019/0190473 A1 Jun. 20, 2019

Related U.S. Application Data

(63) Continuation of application No. 16/122,336, filed on Sep. 5, 2018, now Pat. No. 10,250,208.

(30) Foreign Application Priority Data

Sep. 7, 2017 (IT) .............................. MI2017A0359

(51) Int. Cl.
*H03F 3/45* (2006.01)
*H03F 3/183* (2006.01)
(Continued)

(52) U.S. Cl.
CPC ......... *H03F 3/45475* (2013.01); *H03F 3/183* (2013.01); *H03F 3/45941* (2013.01);
(Continued)

(58) Field of Classification Search
CPC .. H03F 3/45475; H03F 3/183; H03F 2200/03; H03F 2200/129;
(Continued)

(56) References Cited

U.S. PATENT DOCUMENTS 5,621,357 A * 4/1997 Botti ..................... H03F 1/3217
330/253
6,429,734 B1 8/2002 Wang et al.
(Continued)

OTHER PUBLICATIONS

Hussain Alzaher et al., "A CMOS Fully Balanced Differential Difference Amplifier and Its Applications," *IEEE Transactions on Circuits and Systems—II: Analog and Digital Signal Processing* 48(6):614-620, Jun. 2001.
(Continued)

*Primary Examiner* — Mohammad K Islam
(74) *Attorney, Agent, or Firm* — Seed IP Law Group LLP

(57) ABSTRACT

A circuit for amplifying signals from a Micro Electro-Mechanical System (MEMS) capacitive sensor is provided. First and second input nodes receive a sensing signal applied differentially between the input nodes. A first amplifier stage and a second amplifier stage, respectively, produce a differential output signal between first and second output nodes. A common mode signal is detected at the output nodes. A voltage divider having an intermediate tap node is coupled between the first output node and the second output node. A feedback stage is coupled between the intermediate tap node of the voltage divider and the inputs of the first amplifier stage and the second amplifier stage, where the feedback line is sensitive to the common mode signal at the output nodes.

24 Claims, 3 Drawing Sheets

(51) Int. Cl.
*H04R 19/04* (2006.01)
*H04R 19/00* (2006.01)
*H04R 3/00* (2006.01)

(52) U.S. Cl.
CPC .......... *H04R 19/005* (2013.01); *H04R 19/04* (2013.01); *H03F 2200/03* (2013.01); *H03F 2200/129* (2013.01); *H03F 2203/45116* (2013.01); *H03F 2203/45512* (2013.01); *H03F 2203/45544* (2013.01); *H03F 2203/45594* (2013.01); *H04R 3/00* (2013.01); *H04R 2201/003* (2013.01)

(58) Field of Classification Search
CPC . H03F 2203/45116; H03F 2203/45512; H03F 2203/45544; H04R 19/005; H04R 19/04; H04R 2201/003
See application file for complete search history.

(56) References Cited

U.S. PATENT DOCUMENTS

| | | |
|---|---|---|
| 8,855,335 B2 | 10/2014 | Henriksen et al. |
| 9,014,398 B2 | 4/2015 | Onishi |
| 9,083,286 B2 | 7/2015 | Kropfitsch et al. |
| 9,083,288 B2 | 7/2015 | Thomsen et al. |
| 9,484,872 B1* | 11/2016 | Conte .................. H03F 3/45179 |
| 2008/0197928 A1* | 8/2008 | Watson ............... H03F 3/45475 330/260 |
| 2013/0195291 A1 | 8/2013 | Josefsson |
| 2013/0271307 A1 | 10/2013 | Kropfitsch et al. |
| 2014/0176239 A1* | 6/2014 | Duggal ............... H03F 3/45183 330/260 |
| 2015/0061764 A1* | 3/2015 | Lee ..................... H03F 3/45183 330/254 |
| 2015/0281836 A1 | 10/2015 | Nguyen et al. |
| 2015/0318829 A1* | 11/2015 | Astgimath ............. H03F 3/505 381/120 |
| 2016/0056776 A1* | 2/2016 | Frohlich .................. H03F 1/34 330/291 |
| 2016/0111954 A1 | 4/2016 | Bach et al. |
| 2016/0352294 A1 | 12/2016 | Nicollini et al. |
| 2017/0359036 A1* | 12/2017 | Frohlich ................. H04R 3/06 |
| 2018/0234762 A1 | 8/2018 | Ganta et al. |
| 2018/0234763 A1 | 8/2018 | Ganta et al. |

OTHER PUBLICATIONS

Eduard Säckinger et al., "A Versatile Building Block: The CMOS Differential Difference Amplifier," *IEEE Journal of Solid-State Circuits SC-22*(2):287-294, Apr. 1987.

* cited by examiner

AMPLIFIER CIRCUIT, CORRESPONDING SYSTEM AND DEVICE

BACKGROUND

Technical Field

The present description relates to amplifier circuits.

One or more embodiments may be applied to microphone systems, e.g., in Micro Electro-Mechanical Systems—MEMS.

Description of the Related Art

Digital read-out application-specific integrated circuits—ASICs for, e.g., MEMS microphones conventionally include an analog interface and an analogue-to-digital converter, such as an oversampling sigma-delta converter.

The microphone may include a variable capacitance with a fixed charge and a plate, called membrane, capable of bending when sound pressure is incident on the plate.

In the presence of a charge, which is fixed, the variation in capacitance generates a voltage across the sensor.

For that reason, an analog interface is conventionally used having:
 a high input impedance for sensing the voltage, in order to avoid variations in the charged store in the microphone, and
 a low output impedance to drive the load, usually represented by the input capacitance of the cascaded analog-to-converter.

The front end circuitry described may also act as a gain stage to facilitate obtaining an adequate amplitude of the output digital signal for external blocks.

BRIEF SUMMARY

According to one or more embodiments, a circuit is provided.

One or more embodiments may relate to a corresponding system and a corresponding device.

BRIEF DESCRIPTION OF THE SEVERAL VIEWS OF THE DRAWINGS

One or more embodiments will now be described, by way of example only, with reference to the annexed figures, wherein.

DETAILED DESCRIPTION

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more portions of the present description do not necessarily refer to one and the same embodiment. Moreover, particular conformations, structures, or characteristics may be combined in any adequate way in one or more embodiments.

The references used herein are provided merely for convenience and hence do not confine the extent of protection or the scope of the embodiments.

Figure 1:
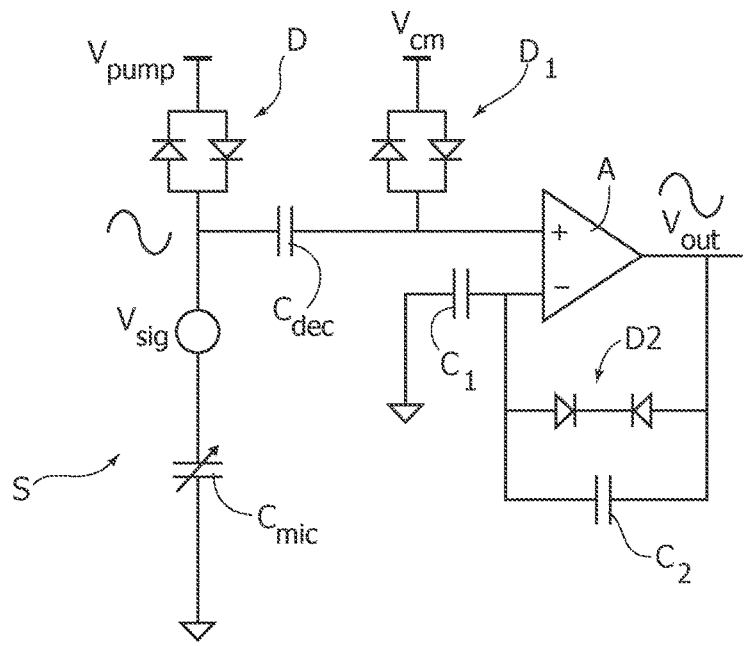
FIG. 1 is a block diagram exemplary of a MEMS architecture.

In the block diagram of FIG. 1 (which is a block diagram exemplary of a conventional MEMS architecture) reference S indicates a capacitive microphonic sensor biased by a pair of diodes D and a charge pump at a voltage Vpump.

A sensor S as exemplified herein can be represented as a (variable) capacitor Cmic adapted to generate a voltage Vsig which can be expressed as:

$$V\text{sig}=Q/C\text{mic}$$

where:
 Q is a (fixed) electrical charge stored in the sensor, biased by the voltage pump, and
 Cmic is exemplary of the capacitance of the microphone.

The capacitance Cmic can vary as a function of sound pressure so that the sensor S may produce a microphone signal Vsig which is a function of the variable capacitance.

The signal Vsig can be fed, e.g., via a de-coupling capacitor Cdec to an amplifier stage A to produce an output signal Vout.

The amplifier stage A may include an operational amplifier (op-amp), e.g., in a non-inverting configuration.

The output signal Vout can be expressed as:

$$V\text{out}=V\text{sig}*[1+(C1/C2)]$$

where C1 and C2 indicate respective capacitances of two capacitors included in a (negative) feedback loop of the operational amplifier A, with D2 indicative of a pair of diodes arranged back-to-back (anode-to-anode) in parallel to the capacitor C2.

Being a single-ended layout, an arrangement as exemplified in FIG. 1 has a low rejection in respect of any form of common-mode disturbance as schematically represented by Vcm and a pair of diodes D1. Also, power consumption and the total harmonic distortion represent conflicting factors for which a compromise is pursued. This leads to restrictions in the overall performance of the circuit.

Figure 2:
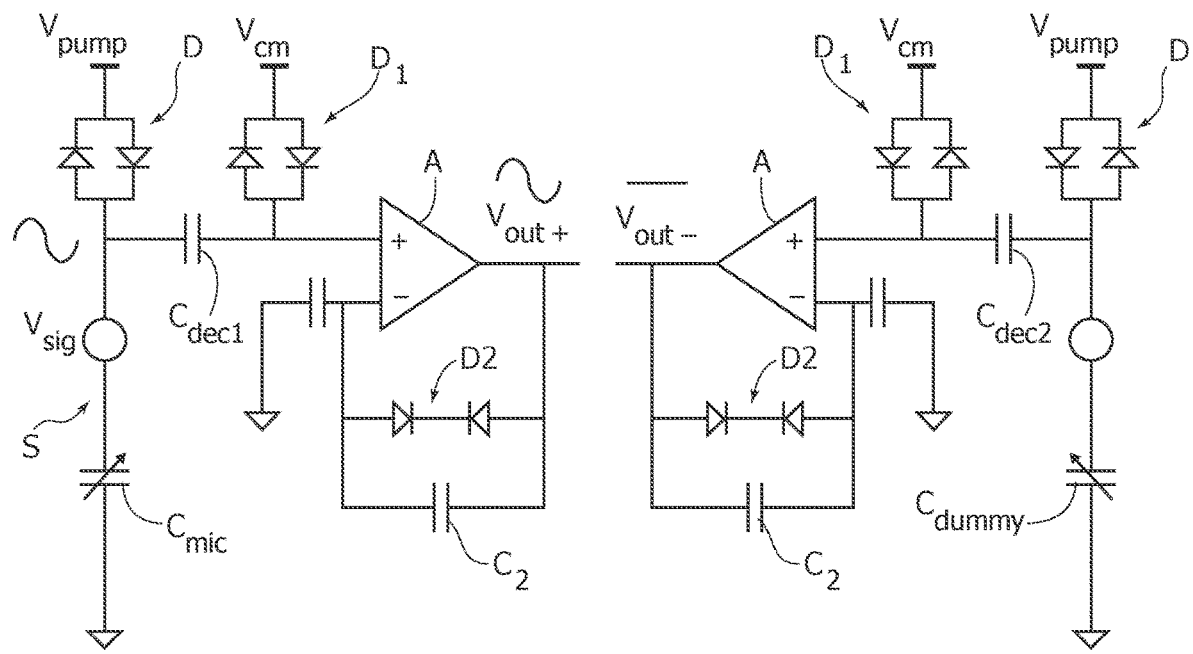
FIG. 2 is a block diagram of a possible development of the layout of FIG. 1.

These issues can be addressed by resorting to a circuit layout as shown in FIG. 2.

In FIG. 2 parts or elements like parts or elements already discussed in connection with FIG. 1 are indicated with like references, so that a detailed description will not be repeated for brevity.

In brief, the circuit layout as shown in FIG. 2 can be regarded as being obtained by, what may be described as, mirror-like duplicating of the circuit layout of FIG. 1, by using (in the "duplicated" circuit shown on the right of FIG. 2) a dummy capacitance Cdummy mirroring the microphone capacitor Cmic and having the same capacitance value of the capacitor Cmic (in the absence of variations induced by sound pressure).

An arrangement as exemplified in FIG. 2—based on a pseudo-differential approach—may come close to the advantages of a fully-differential layout, save for the output voltage headroom.

In fact, in an arrangement as exemplified in FIG. 2, an input signal is applied (via a capacitance Cdec1) only on the left side of the circuit while the other input (the one to which the dummy capacitor Cdummy is coupled via a capacitance Cdec2) is fixed. This may lead to higher power supply values (with the corresponding increased power consumption) being applied in order to avoid clamping effects which may adversely affect the output signal, by increasing total harmonic distortion.

Figure 3:
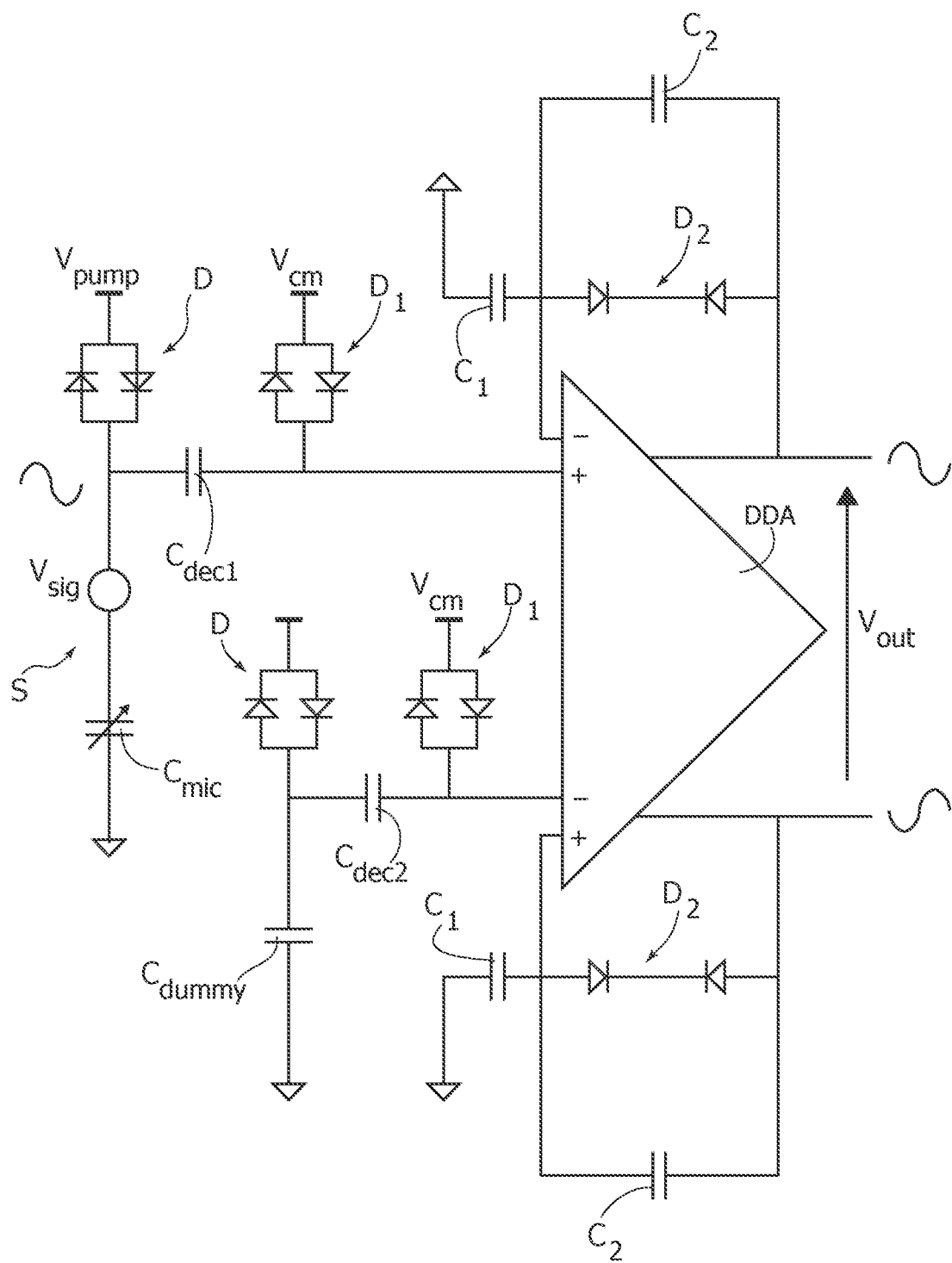
FIG. 3 is a block diagram exemplary of a further possible development over the solutions of FIGS. 1 and 2.

This issue may be addressed by resorting to a circuit with two out-of-phase output signal components, e.g., by resorting to a circuit layout as exemplified in FIG. 3; see, e.g.:

E. Sackinger, et al.: "A versatile building block: the CMOS differential difference amplifier", IEEE Journal of Solid-State Circuits, Vol. 22, April 1987;

H. Alzaher, et al.: "A CMOS Fully Balanced Differential Difference Amplifier and Its Applications", IEEE TCAS-II: Analog and Digital Signal Processing, Vol. 48, No. 6, June 2001.

Again, in FIG. 3 parts or element like parts or elements already discussed in connection with FIGS. 1 and 2 are indicated with like numerals; a corresponding description will not be repeated here for brevity.

Briefly, in a layout as exemplified in FIG. 3, the two amplifier stages A in FIG. 2 are incorporated to a single differential difference amplifier DDA which provides the output voltage Vout.

A layout as exemplified in FIG. 3 offers a good total harmonic distortion (THD) behavior.

It was, however, observed that a layout as exemplified in FIG. 3 may exhibit a number of drawbacks.

In the first place, it has to cope with different common-mode input signals Vcm on its input stages, which translates into a larger common-mode input range.

Also, the transistors in each input stage are driven by a large differential signal; that is, the virtual ground principle as known in the art does not apply, which leads to (high) distortion for large-amplitude signals with pairs of back-to-back diodes D2 in (both) feedback networks of the differential difference amplifier DDA.

Finally, a differential signal is present only on the outputs in so far as the inputs are not (fully) differential. This may result in reduced rejection of common-mode disturbance, that is TDMA noise.

Figure 4:
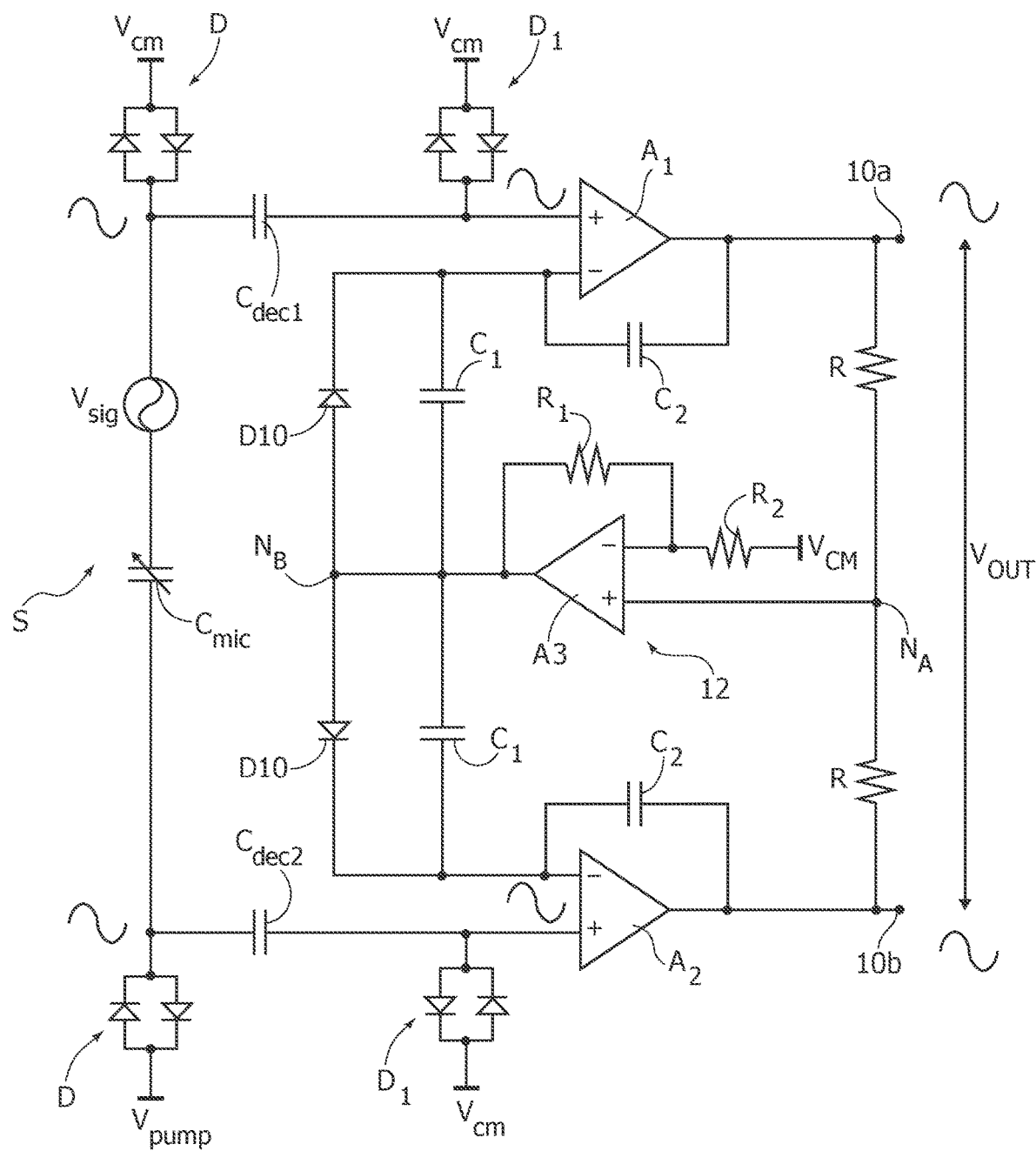
FIG. 4 is a block diagram of an exemplary of embodiment.

These issues can be addressed by resorting to embodiments as exemplified in FIG. 4.

Here again, parts or elements like parts or elements already discussed in connection with FIGS. 1 to 3 are indicated with like references, and a description of these parts or elements is not repeated for brevity.

The layout exemplified in FIG. 4 is fully differential (both input and output nodes) with the sensor S in a (truly) differential configuration.

This facilitates meeting more challenging specifications in terms of, e.g., TDMA noise.

Moreover, a layout as exemplified in FIG. 4 exhibits a low distortion due to a "halved" signal being applied at its input and the absence of diodes in the output stages.

A circuit layout is exemplified in FIG. 4 can be regarded as one where the two amplifier stages A in the mirror-like arrangement are mutually coupled by means of a feedback network including two resistors R forming a voltage divider across the outputs 10a, 10b of the (op-amp) amplifier stages A1, A2. The voltage divider includes a tap node $N_A$ between the resistors R (assumed to have a same resistance value) coupled to a feedback line 12 towards a node $N_B$ coupled to the inputs of the amplifier stages A1 and A2.

In the circuit layout as exemplified in FIG. 4, the feedback line 12 includes a further amplifier A3 (e.g., an op-amp) arranged with a first (e.g., non-inverting) input coupled to the node $N_A$ and an output coupled to the node $N_B$.

The amplifier A3 in the feedback line/network 12, in turn, includes a resistive feedback network including two resistors R1, R2.

The first resistor R1 is set between the other (e.g., inverting) input of the amplifier A3 and the output of the amplifier A3.

The second resistor R2 is coupled to the other (e.g., inverting) input of the amplifier A3 and is sensitive to a common mode voltage $V_{CM}$.

The voltage $V_{CM}$ can be provided as a reference—in a manner known per se—e.g., via a bandgap, possibly filtered via a low-pass filter having a (very) low cutoff frequency and fed to the circuit.

The (feedback) capacitors C1 of the two amplifiers A1, A2 are coupled to each other at the node $N_B$ with associated diodes D10 arranged in parallel with the capacitors C1, so that the diodes D10 are arranged back-to-back (e.g., anode-to-anode) to each other.

In a "floating" arrangement as exemplified in FIG. 4, the sensor S may be expected to see two series impedances which are essentially the same, so that the signal Vsig generated by the sensor S is divided into two identical signals having a same ("halved") amplitude and opposite polarity or sign, thus relaxing the distortion constraints on the input signal.

Since the parasitic capacitances on the membrane and on the backplate of the sensing capacitor Cmic may be different, the values of the de-coupling capacitances Cdec1 and Cdec2 can be adjusted to equalize the two impedances.

The signals from the sensor S are amplified by the factor $[1+(C1/C2)]$ to produce the differential output Vout.

The feedback network senses the common mode output and amplifies it with a non-inverting configuration by a factor $[1+(R1/R2)]$, with two single-ended outputs generated through the inverting configuration with gain—C1/C2.

In the presence of perfectly fully-balanced inputs, the feedback network R, 12 will notionally have no effect in so far as the common mode output signal will be zero.

The (negative) feedback line R, 12 thus operates only on the common mode output signal and only if this differs from zero, thus targeting cancellation thereof.

This results in a reduction in the swing on the nodes $N_A$ and $N_B$ with the requirements on the amplifier A3 in the feedback 12 correspondingly relaxed.

A circuit according to one or more embodiments may include:

a first input node (e.g., at Cdec1) and a second input node (e.g., at Cdec2) configured for receiving a sensing signal (e.g., Vsig) applied differentially therebetween, a first amplifier stage (e.g., A1) having a first output node (e.g., 10a) and a second amplifier stage (e.g., A2) having a second output node (e.g., 10b), the first amplifier stage and the second amplifier stage coupled to the first input node and to the second input node, respectively, to produce a differential output signal (e.g., Vout) between the first output node and the second output node, with a common mode signal at the output nodes, a voltage divider (e.g., the resistors R between 10a and 10b) set between the first output node and the second output node, the voltage divider having an intermediate tap node (e.g., $N_A$), a feedback line (e.g., 12), acting between the tap node of the voltage divider and the inputs (e.g., vie the capacitors C1) of the first amplifier stage and the second amplifier stage, wherein the feedback line is sensitive (e.g., via the amplifier A3) to the common mode signal at the output nodes.

In one or more embodiments, the feedback line may be active between the tap point of the voltage divider and a common node (e.g., $N_B$) capacitively coupled (see, e.g., C1) to the inputs of the first amplifier stage and the second amplifier stage.

In one or more embodiments, the first amplifier stage and the second amplifier stage may include respective differential amplifier stages with first and second inputs, wherein:

the first input of the first amplifier stage is coupled to the first input node, the first input of the second amplifier stage is coupled to the second input node, the second inputs of the first amplifier stage and the second amplifier stage are coupled (e.g., via the capacitors C1) to the feedback line (e.g., $N_B$, 12).

In one or more embodiments, the first and second inputs of the first amplifier stage and the second amplifier stage may include non-inverting and inverting inputs, respectively, of the respective differential amplifier stages.

In one or more embodiments, the first amplifier stage and the second amplifier stage may include respective capacitive feedback networks (e.g., C1, C2) in turn including a first capacitor and a second capacitor, wherein:

i) the first capacitor (C1) is set:
between the feedback line and the input of the first amplifier stage, and
between the feedback line and the input of the second amplifier stage, respectively, ii) the second capacitor (C2) is set:
between the first output node and the input of the first amplifier stage, and
between the second output node and the input of the second amplifier stage, respectively.

In one or more embodiments, the feedback line may include a further amplifier stage (e.g., A3) in turn including:
a first input coupled to the tap node ($N_A$) of the voltage divider,
a second input sensitive to a common mode reference signal (e.g., $V_{CM}$),
an output coupled to the inputs of the first amplifier stage and the second amplifier stage.

In one or more embodiments, the further amplifier stage in the feedback line may include a resistive feedback network in turn including:
a first resistor (e.g., R1) between said second input and the output of the further amplifier, and
a second resistor (e.g., R2) coupled with said first input and sensitive to said common mode reference signal (e.g., $V_{CM}$).

In one or more embodiments, a system may include:
a circuit according to one or more embodiments, and
a sensor (e.g., S) arranged between the first input node (Cdec1) and the second input node (Cdec2) to apply said sensing signal (e.g., Vsig) differentially therebetween.

In one or more embodiments, the sensor (S) may include a capacitive microphonic sensor.

In one or more embodiments, a MEMS device may include a system according to one or more embodiments.

Without prejudice to the underlying principles, the details and the embodiments may vary with respect to what has been described by way of example only without departing from the embodiments described herein.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A circuit, comprising:
a first amplifier stage;
a second amplifier stage, the first and second amplifier stages being configured to produce a differential output signal at outputs of the first and second amplifier stages;
a voltage divider coupled to the outputs of the first and second amplifier stages and having an intermediate tap node; and
a feedback stage coupled to the intermediate tap node and first inputs of the first and second amplifier stages, respectively, and configured to sense a common mode signal at the intermediate tap node, wherein the feedback stage is coupled to the first inputs of the first and second amplifier stases by first and second capacitances, respectively.

2. The circuit of claim 1, wherein the first amplifier stage has a second input and the second amplifier stage has a second input and wherein the first and second amplifier stages are configured to differentially receive a sensing signal over the second inputs.

3. The circuit of claim 1, wherein the first amplifier stage includes a first differential amplifier having a non-inverting input and an inverting input, and the second amplifier stage includes a second differential amplifier having a non-inverting input and an inverting input, wherein the first and second differential amplifiers are configured to differentially receive a sensing signal over the non-inverting inputs, and wherein the first and second differential amplifiers are coupled to the feedback stage over the inverting inputs, respectively.

4. The circuit of claim 1, wherein:
the first amplifier stage includes: a first capacitive feedback network that includes the first, and a third capacitance coupled between the output of the first amplifier stage and the first input of the first amplifier stage; and
the second amplifier stage includes: a second capacitive feedback network that includes the second capacitance, and a fourth capacitance coupled between the output of the second amplifier stage and the first input of the second amplifier stage.

5. The circuit of claim 1, wherein the feedback stage includes a further amplifier stage including:
a first input coupled to the intermediate tap node of the voltage divider;
a second input configured to receive a common mode reference signal; and
an output coupled to the first inputs of the first and second amplifier stages.

6. The circuit of claim 5, wherein the further amplifier stage includes a resistive feedback network including:
- a first resistance coupled between the second input of the further amplifier stage and the output of the further amplifier stage; and
- a second resistance having a first side coupled to the second input of the further amplifier stage and a second side configured to receive the common mode reference signal.

7. A system, comprising:
- a first amplifier stage;
- a second amplifier stage, the first and second amplifier stages being configured to produce a differential output signal at outputs of the first and second amplifier stages;
- a voltage divider coupled to the outputs of the first and second amplifier stages and having an intermediate tap node;
- a feedback stage coupled to the intermediate tap node and first inputs of the first and second amplifier stages, respectively, and configured to sense a common mode signal at the intermediate tap node; and
- a sensor coupled to second inputs of the first and second amplifier stages and configured to provide a sensing signal differentially to the second inputs of the first and second amplifier stages.

8. The system of claim 7, wherein the sensor is capacitive microphonic sensor.

9. The system of claim 7, wherein the feedback stage is coupled to the first inputs of the first and second amplifier stages by first and second capacitances, respectively.

10. The system of claim 7, wherein the first amplifier stage includes a first differential amplifier having a non-inverting input and an inverting input, and the second amplifier stage includes a second differential amplifier having a non-inverting input and an inverting input, wherein the first and second differential amplifiers are configured to differentially receive the sensing signal over the non-inverting inputs, and wherein the first and second differential amplifiers are coupled to the feedback stage over the inverting inputs, respectively.

11. The system of claim 7, wherein:
- the first amplifier stage includes: a first capacitive feedback network that includes a first capacitance coupled between the feedback stage and the first input of the first amplifier stage, and a second capacitance coupled between the output of the first amplifier stage and the first input of the first amplifier stage; and
- the second amplifier stage includes: a second capacitive feedback network that includes a third capacitance coupled between the feedback stage and the first input of the second amplifier stage, and a fourth capacitance coupled between the output of the second amplifier stage and the first input of the second amplifier stage.

12. The system of claim 7, wherein the feedback stage includes a further amplifier stage including:
- a first input coupled to the intermediate tap node of the voltage divider;
- a second input configured to receive a common mode reference signal; and
- an output coupled to the first inputs of the first and second amplifier stages.

13. The system of claim 12, wherein the further amplifier stage includes a resistive feedback network including:
- a first resistance coupled between the second input of the further amplifier stage and the output of the further amplifier stage; and
- a second resistance having a first side coupled to the second input of the further amplifier stage and a second side configured to receive the common mode reference signal.

14. A Micro Electro-Mechanical Systems (MEMS) device, comprising:
- a first amplifier stage;
- a second amplifier stage, the first and second amplifier stages being configured to produce a differential output signal at outputs of the first and second amplifier stages;
- a voltage divider coupled to the outputs of the first and second amplifier stages and having an intermediate tap node;
- a feedback stage coupled to the intermediate tap node and first inputs of the first and second amplifier stages, respectively, and configured to sense a common mode signal at the intermediate tap node, wherein the feedback stage is coupled to the first input of the first amplifier stage by a first capacitance and the feedback stage is coupled to the first input of the second amplifier stage by a second capacitance; and
- a MEMS sensor coupled to second inputs of the first and second amplifier stages and configured to provide a sensing signal differentially to the second inputs.

15. The MEMS device of claim 14, wherein the first amplifier stage includes a first differential amplifier having a non-inverting input and an inverting input, and the second amplifier stage includes a second differential amplifier having a non-inverting input and an inverting input, wherein the first and second differential amplifiers are configured to differentially receive the sensing signal over the non-inverting inputs, and wherein the first and second differential amplifiers are coupled to the feedback stage over the inverting inputs, respectively.

16. The MEMS device of claim 14, wherein:
- the first amplifier stage includes: a first capacitive feedback network that includes the first capacitance, and a third capacitance coupled between the output of the first amplifier stage and the first input of the first amplifier stage; and
- the second amplifier stage includes: a second capacitive feedback network that includes the second capacitance, and a fourth capacitance coupled between the output of the second amplifier stage and the first input of the second amplifier stage.

17. The MEMS device of claim 14, wherein the feedback stage includes a further amplifier stage including:
- a first input coupled to the intermediate tap node of the voltage divider;
- a second input configured to receive a common mode reference signal; and
- an output coupled to the first inputs of the first and second amplifier stages.

18. The MEMS device of claim 17, wherein the further amplifier stage includes a resistive feedback network including:
- a first resistance coupled between the second input of the further amplifier stage and the output of the further amplifier stage; and
- a second resistance having a first side coupled to the second input of the further amplifier stage and a second side configured to receive the common mode reference signal.

19. A circuit, comprising:
a first amplifier stage;
a second amplifier stage, the first and second amplifier stages being configured to produce a differential output signal at outputs of the first and second amplifier stages;
a voltage divider coupled to the outputs of the first and second amplifier stages and having an intermediate tap node; and
a feedback stage coupled to the intermediate tap node and first inputs of the first and second amplifier stages, respectively, and configured to sense a common mode signal at the intermediate tap node, wherein the first amplifier stage includes a first differential amplifier having a non-inverting input and an inverting input, and the second amplifier stage includes a second differential amplifier having a non-inverting input and an inverting input, wherein the first and second differential amplifiers are configured to differentially receive a sensing signal over the non-inverting inputs, and wherein the first and second differential amplifiers are coupled to the feedback stage over the inverting inputs, respectively.

20. The circuit of claim 19, wherein:
the first amplifier stage includes: a first capacitive feedback network that includes a first capacitance coupled between the feedback stage and the first input of the first amplifier stage, and a second capacitance coupled between the output of the first amplifier stage and the first input of the first amplifier stage; and
the second amplifier stage includes: a second capacitive feedback network that includes a third capacitance coupled between the feedback stage and the first input of the second amplifier stage, and a fourth capacitance coupled between the output of the second amplifier stage and the first input of the second amplifier stage.

21. The circuit of claim 19, wherein the feedback stage includes a further amplifier stage including:
a first input coupled to the intermediate tap node of the voltage divider;
a second input configured to receive a common mode reference signal; and
an output coupled to the first inputs of the first and second amplifier stages.

22. A circuit, comprising:
a first amplifier stage;
a second amplifier stage, the first and second amplifier stages being configured to produce a differential output signal at outputs of the first and second amplifier stages;
a voltage divider coupled to the outputs of the first and second amplifier stages and having an intermediate tap node; and
a feedback stage coupled to the intermediate tap node and first inputs of the first and second amplifier stages, respectively, and configured to sense a common mode signal at the intermediate tap node, wherein the feedback stage includes a further amplifier stage including:
a first input coupled to the intermediate tap node of the voltage divider;
a second input configured to receive a common mode reference signal; and
an output coupled to the first inputs of the first and second amplifier stages.

23. The circuit of claim 22, wherein the first amplifier stage has a second input and the second amplifier stage has a second input and wherein the first and second amplifier stages are configured to differentially receive a sensing signal over the second inputs.

24. The circuit of claim 22, wherein:
the first amplifier stage includes: a first capacitive feedback network that includes a first capacitance coupled between the feedback stage and the first input of the first amplifier stage, and a second capacitance coupled between the output of the first amplifier stage and the first input of the first amplifier stage; and
the second amplifier stage includes: a second capacitive feedback network that includes a third capacitance coupled between the feedback stage and the first input of the second amplifier stage, and a fourth capacitance coupled between the output of the second amplifier stage and the first input of the second amplifier stage.

* * * * *

UNITED STATES PATENT AND TRADEMARK OFFICE
CERTIFICATE OF CORRECTION

PATENT NO. : 10,536,122 B2
APPLICATION NO. : 16/282208
DATED : January 14, 2020
INVENTOR(S) : Edoardo Marino Page 1 of 1

It is certified that error appears in the above-identified patent and that said Letters Patent is hereby corrected as shown below:

In the Claims

Column 6, Line 34:
"second amplifier stases by first and second capacitances" should read, --second amplifier stages by first and second capacitances--.

Column 6, Line 52:
"back network than includes the first, and a third capacitance" should read, --back network than includes the first capacitance, and a third capacitance--.

Signed and Sealed this
Ninth Day of June, 2020

Andrei Iancu
*Director of the United States Patent and Trademark Office*